(12) United States Patent
Cheng et al.

(10) Patent No.: US 9,743,551 B2
(45) Date of Patent: Aug. 22, 2017

(54) THERMAL PIEZOELECTRIC APPARATUS

(71) Applicant: ICE Computer, Inc., Saratoga, CA (US)

(72) Inventors: Shang-Che Cheng, Saratoga, CA (US); Catherine Cheng, Saratoga, CA (US)

(73) Assignee: ICE Computer, Inc., Saratoga, CA (US)

( * ) Notice: Subject to any disclaimer, the term of this patent is extended or adjusted under 35 U.S.C. 154(b) by 0 days.

(21) Appl. No.: 14/867,655

(22) Filed: Sep. 28, 2015

(65) Prior Publication Data

US 2016/0095255 A1 Mar. 31, 2016

Related U.S. Application Data

(60) Provisional application No. 62/057,092, filed on Sep. 29, 2014.

(51) Int. Cl.
*H01L 41/09* (2006.01)
*H05K 7/20* (2006.01)

(52) U.S. Cl.
CPC ..... *H05K 7/20172* (2013.01); *H01L 41/0926* (2013.01); *H01L 41/0933* (2013.01)

(58) Field of Classification Search
CPC ............ H01L 41/0926; H01L 41/0933; H01L 41/094; H05K 7/20336
USPC ......................................... 310/328, 330–332
See application file for complete search history.

(56) References Cited

U.S. PATENT DOCUMENTS

| | | | |
|---|---|---|---|
| 2007/0139938 A1* | 6/2007 | Petroski | F21V 29/70 362/373 |
| 2011/0041246 A1* | 2/2011 | Li | A47C 21/044 5/421 |
| 2014/0271277 A1* | 9/2014 | Whalen | F04B 43/046 417/413.2 |

* cited by examiner

*Primary Examiner* — Derek Rosenau
(74) *Attorney, Agent, or Firm* — VLP Law Group LLP; Edward Kwok

(57) ABSTRACT

An integrated thermal apparatus includes a piezoelectric device and a thermal module which includes a thermal plate contacting a heat source to remove heat from the heat source. The thermal plate has built-in heat sinks for maximizing the surface area for heat dissipation. Each piezoelectric device includes one or more piezoelectric elements. Through the actions of piezoelectric elements, a jet of air and an influx of air are generated to cool the heat sinks. The airflow also cools the surface of heat plate, which acts like a fan mounted on top of the heat source.

8 Claims, 4 Drawing Sheets

THERMAL PIEZOELECTRIC APPARATUS

CROSS REFERENCE TO RELATED APPLICATIONS

The present application is related to and claims priority of U.S. provisional patent application ("Provisional Application"), Ser. No. 62/057,092, entitled "Thermal Piezo Apparatus," filed on Sep. 29, 2014. The disclosure of the Provisional Application is hereby incorporated by reference in its entirety.

BACKGROUND OF THE INVENTION

1. Field of the Invention

The present invention relates to a cooling module and, more particularly, a piezoelectric air jet with an integrated heat dissipating module to augment cooling for electronic devices within a limited space.

2. Discussion of the Related Art

There is insufficient space for a convention cooling fan inside a smartphone-size computer. This is especially true for a smartphone-size computer that includes a high-power x86-type processor. To address this cooling issue, thermal management companies, such as SUNON in Taiwan, introduced "mighty mini-fans" which fit into such limited space. However, such "mini-fan" products do not generate enough air flow to cool down the high-power processor effectively. Recently, GE Global Research introduced a piezoelectric "dual cool jets" (DCJ) device and Murata in Japan introduced a "microblower", which acts as a conventional fan. These devices are much thinner.

The piezoelectric phenomenon was first demonstrated in the 1880s. Using the piezoelectric phenomenon in applications of air flow generation began much later. In fact, it is only recently that more piezoelectric products are developed specifically for the electronics cooling market. The inverse of the piezoelectric phenomenon ("the inverse piezo effect")—i.e., stress generation in response to an applied electric field—provides the basis for a new generation of piezo-fans. In a piezo-fan, the inverse piezo effect generates an air flow. Typically, a metal or plastic blade is bonded to a layer of the piezoelectric material ("piezo-layer"). When an electric field is applied to the piezo-layer, the ions in the piezo-layer become aligned, and deform the piezo layer. If the applied electric field is an alternating field, the blade vibrates at substantially the same frequency of the alternating field, thereby generating the air flow. GE's DCJ device is suitable for compact devices, mainly as a stand-alone device that blows air into surrounding electronic components from various angles.

FIG. 1 is a side view of a piezoelectric device, illustrating the expansion and compression of conventional piezoelectric device 170 (e.g., a DCJ device). The jets in a DCJ device were originally developed for controlling air flows around aerodynamic structures, so as to improve aerodynamic performance. Piezoelectric device 170 includes piezoelectric elements 200 that are separated by an elastomer. When a sinusoidal voltage is applied to the piezoelectric elements 200, piezoelectric elements 200 cause expansion and compression of piezoelectric device 170 through the elastomer, thereby allowing fluid to enter and exit piezoelectric device 170 through orifice or opening 180. The expansion and compression result in a strong fluid jet entering and exiting opening 180, even creating vortices that entrain additional fluid downstream of the DCJ device. The fluid jet helps remove heat from heat source 400 (e.g., electronic systems in the vicinity, such as avionics boxes). The result improves avionics computing. However, the DCJ device operates as an independent unit that blows air into heat source 400 only at certain angles, which is not easily adapted to a space-constrained device and impedes properly angling the DCJ device. The DCJ device is not designed to remove heat from heat source 400 quickly and to dissipate heat to a larger surface area.

The DCJ device is not integrated with other thermal modules to maximize heat extraction, dissipation, and cooling operations within the limited space.

SUMMARY OF THE INVENTION

In accordance with one embodiment of the present invention, a piezoelectric device is integrated with a thermal module to dissipate heat generated in a limited space, such as a smartphone-size computer. The present invention provides a "hybrid" thermal module with high thermal design power (TDP) and one or more piezoelectric devices each including a piezoelectric element. The hybrid thermal module may be mounted on a heat source for space-saving efficiency.

In one embodiment, the vibration of the piezoelectric element pushes air directly onto a heat plate. One or more heat sinks may be provided on one surface of the heat plate to increase the surface area for heat dissipation. The air generated by the actions of the piezoelectric elements may blow directly onto the heat sinks. Multiple heat sinks may be provided at different ends of the heat plate to take advantage of the cool air pushed in and out by the piezoelectric elements in predetermined directions to maximize heat dissipation.

The present invention is better understood upon consideration of the detailed description below in conjunction with the accompanying drawings.

BRIEF DESCRIPTION OF THE DRAWINGS

For purposes of clarity and brevity, like elements and components bear the same designations and numbering throughout the figures.

DETAILED DESCRIPTION OF THE PREFERRED EMBODIMENTS

Figure 1:
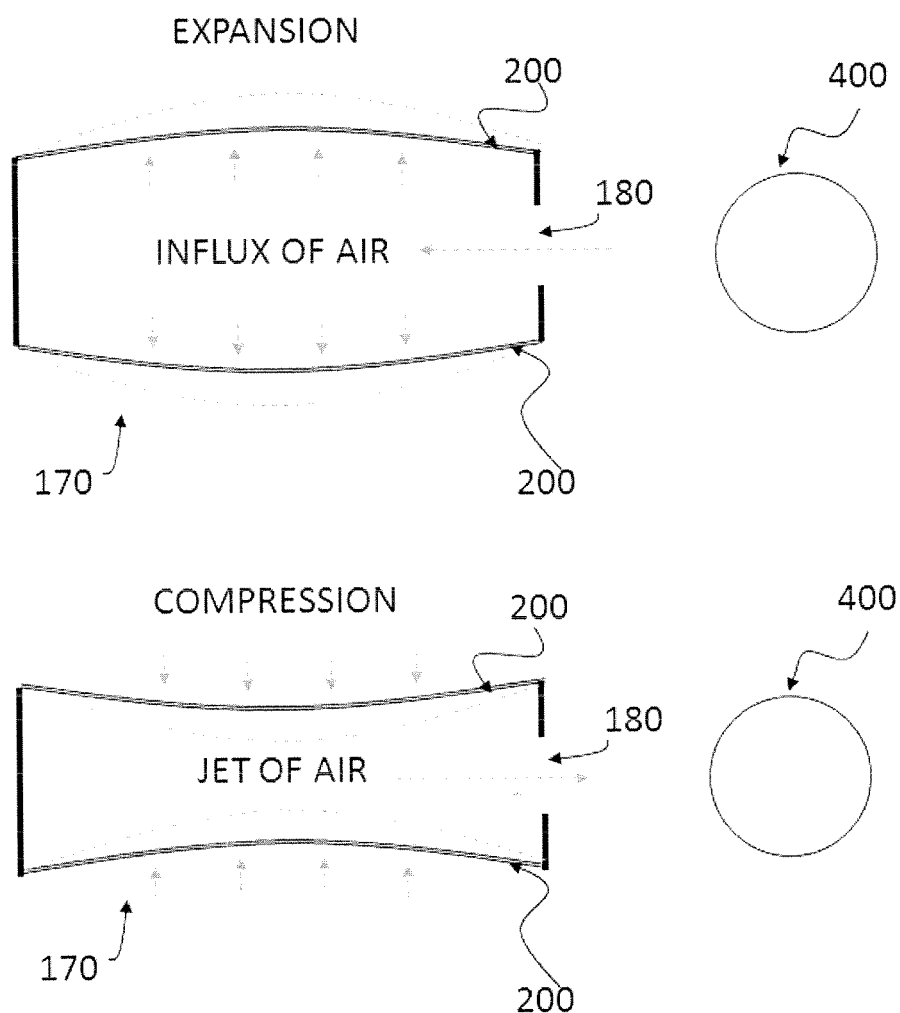
FIG. 1 is a side view of piezoelectric device 170, illustrating the expansion and compression of conventional piezoelectric device 170.
Figure 2:
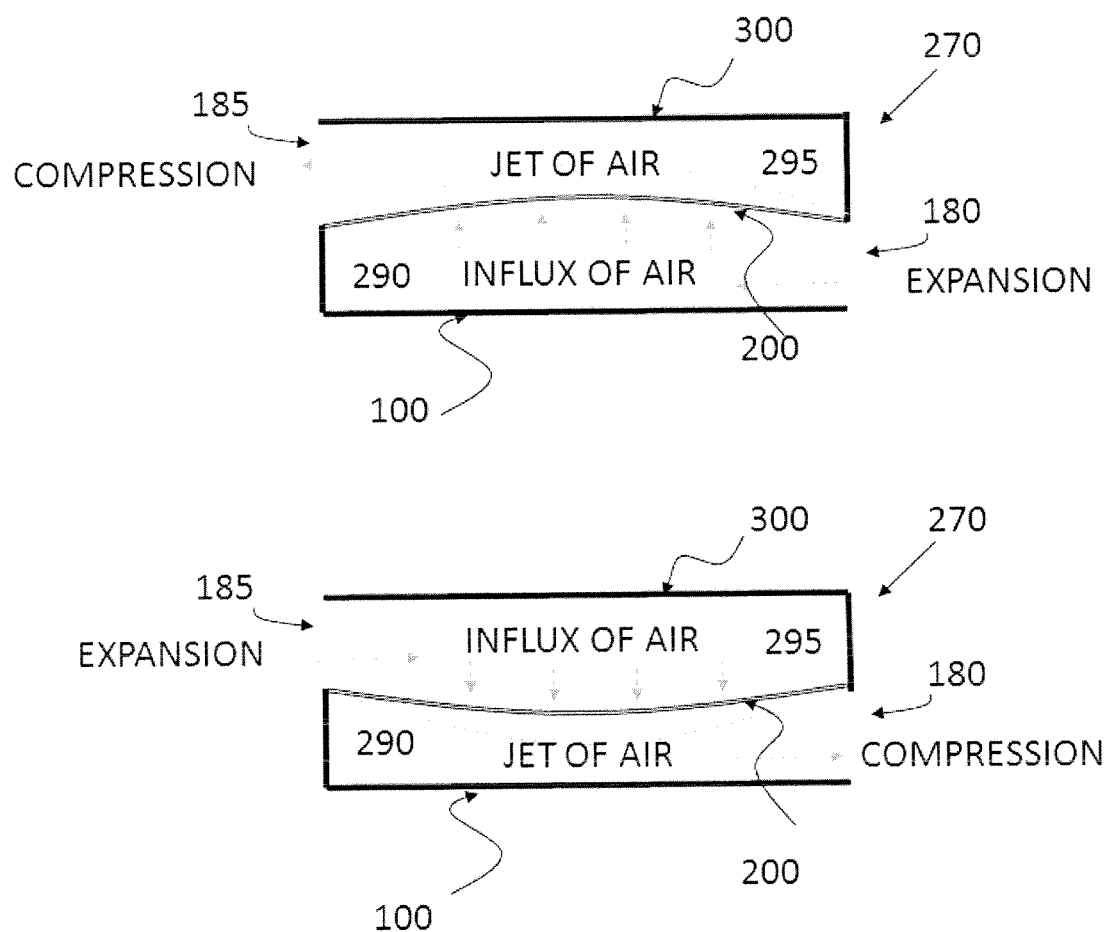
FIG. 2 is aside view of piezoelectric device 270 with multiple air entrances and exits, illustrating expansion and compression due to piezoelectric element 200, in accordance with one embodiment of the present invention.

FIG. 2 is a side view of piezoelectric device 270 with multiple air entrances and exits, illustrating expansion and compression due to piezoelectric element 200, in accordance with one embodiment of the present invention. As shown in FIG. 2, thermal module 100, which is in thermal contact with heat source 400, serves as a base for piezoelectric device 270. Piezoelectric element 200 is provided above thermal module 100. In this embodiment, cover element 300 may be provided above piezoelectric element 200. Thermal module 100 may be any one of: a metal plate, a metal plate with one or more heat sinks, and a metal plate with heat pipe and heatsink 150. Cover element 300 may be any one of: a metal plate, a composite plate, a printed circuit board, or a metal plate attached to another piezoelectric device. In piezoelectric device 270, in one polarity of the applied voltage, deformation of piezoelectric element 200 increases the volume of fluid chamber 290, causing air to flow into chamber 290 through orifice 180, while at the same time decreases the volume of chamber 295, thus forcing an air jet to flow out of chamber 295 through orifice 185. Conversely, when the polarity of the applied voltage is reversed, deformation of piezoelectric element 200 decreases the volume of fluid chamber 290, causing an air jet to flow of chamber 290 through orifice 180, while at the same time increases the volume of chamber 295, causing an air flow into chamber 295 through orifice 185.

In one embodiment, each of fluid chambers 290 and 295 has a height greater than the maximum travel distance of piezoelectric element 200, so as to ensure that deformed piezoelectric element 200 would not come in contact with other elements, during both the expansion and compression of the corresponding fluid chamber. In another embodiment, each fluid chamber has one or more openings in its surrounding walls, positioned so as to direct the air flows in predetermined directions during operations. In this manner, the air flow may be directed to specific heat sources in the vicinity of thermal device 270. Thermal device 270 may be stacked together with like thermal devices. In one embodiment, the air jets out of openings of multiple thermal devices may be directed in the same direction. Alternatively, the air jets out of openings of different thermal devices may be aimed in different directions to increase the covered air flow areas.

Figure 3:
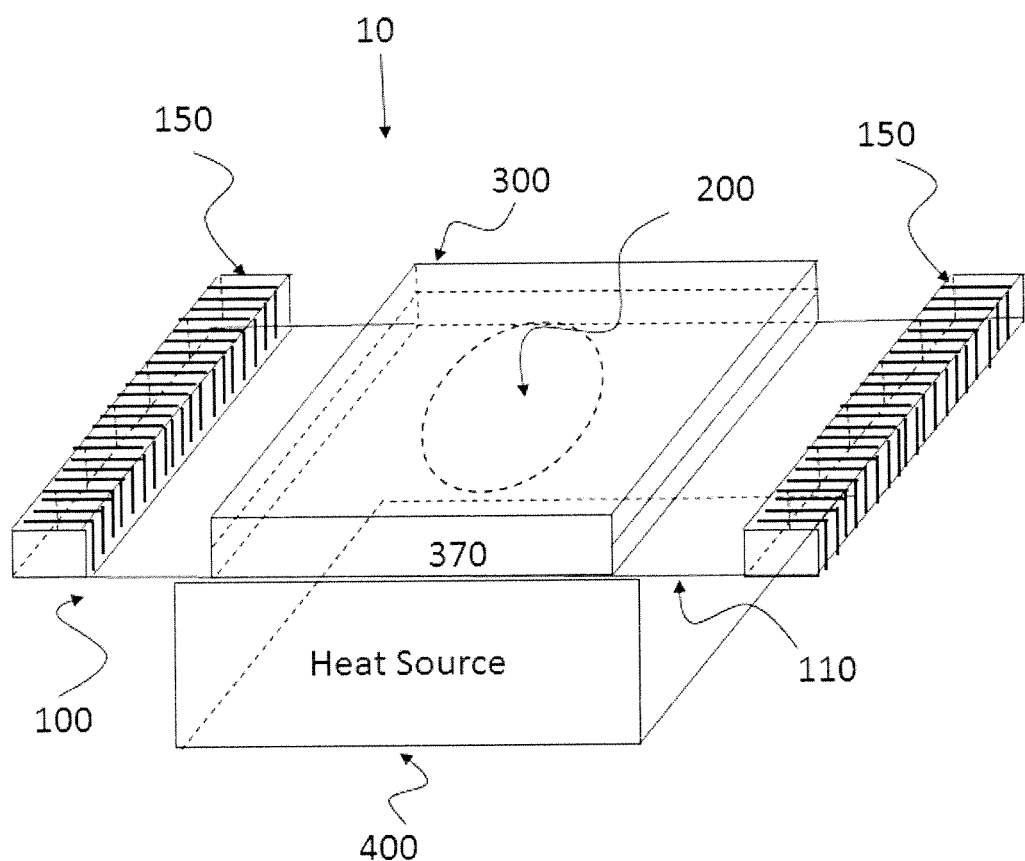
FIG. 3 is a prospect view of thermal piezoelectric apparatus 10, which includes integrated thermal module 100 and thermal device 370 mounted on one surface of heat source 400, in accordance with one embodiment of the present invention; piezoelectric device 370 includes piezoelectric element 200.

FIG. 3 is a prospect view of thermal piezoelectric apparatus 10, which includes integrated thermal module 100 and thermal device 370 mounted on one surface of heat source 400, in accordance with one embodiment of the present invention. Thermal device 370 includes piezoelectric element 200. As shown in FIG. 3, thermal module 100 includes metal plate 110, built-in heat sinks 150, and heat pipes that connect plate 110 to heat sinks 150. Although only the single piezoelectric device 370 is shown in FIG. 3 as being mounted on plate 110, more than one piezoelectric device of the type illustrated by piezoelectric device 370 may be stacked on top of thermal module 100. In this embodiment, cover element 300 is provided on one surface of the stacked piezoelectric devices (i.e., facing opposite direction of plate 100 relative to heat source 400). Control unit 500 (not shown in FIG. 3) drives two-wire or three-wire piezoelectric elements (e.g., piezoelectric element 200) of the piezoelectric devices. As piezoelectric element 200 vibrates in response to an alternating operating voltage applied by control unit 500, air is blown in and out at the openings of piezoelectric device 370. In one embodiment, the cover element 300 is one of a metal plate, a composite plate, or another piezoelectric device. Each fluid chamber of piezoelectric device 370 has a height greater than the maximum travel distance of piezoelectric element 200, so as to ensure that deformed piezoelectric element 200 would not come in contact with other elements, during both the expansion and compression of the fluid chamber. In another embodiment, each chamber has one or more openings in its surrounding walls, positioned so as to direct the air flows in predetermined directions during operations. Heat sinks 150 may also serve as the surrounding walls of the fluid chambers. In this manner, the air flow may be directed to specific heat sources in the vicinity of thermal device 370. Thermal device 370 may be stacked together with other like thermal devices. In one embodiment, the air jets out of openings of multiple thermal devices may be directed in the same direction. Alternatively, the air jets out of openings of different thermal devices may be aimed in different directions to increase the covered air flow areas. In one embodiment, heat plate 110 dissipates heat from heat source 400 through heat sinks 150. In another embodiment, the openings in walls of piezoelectric device 370 direct and blow air into heat sinks 150 for heat dissipation.

Figure 4:
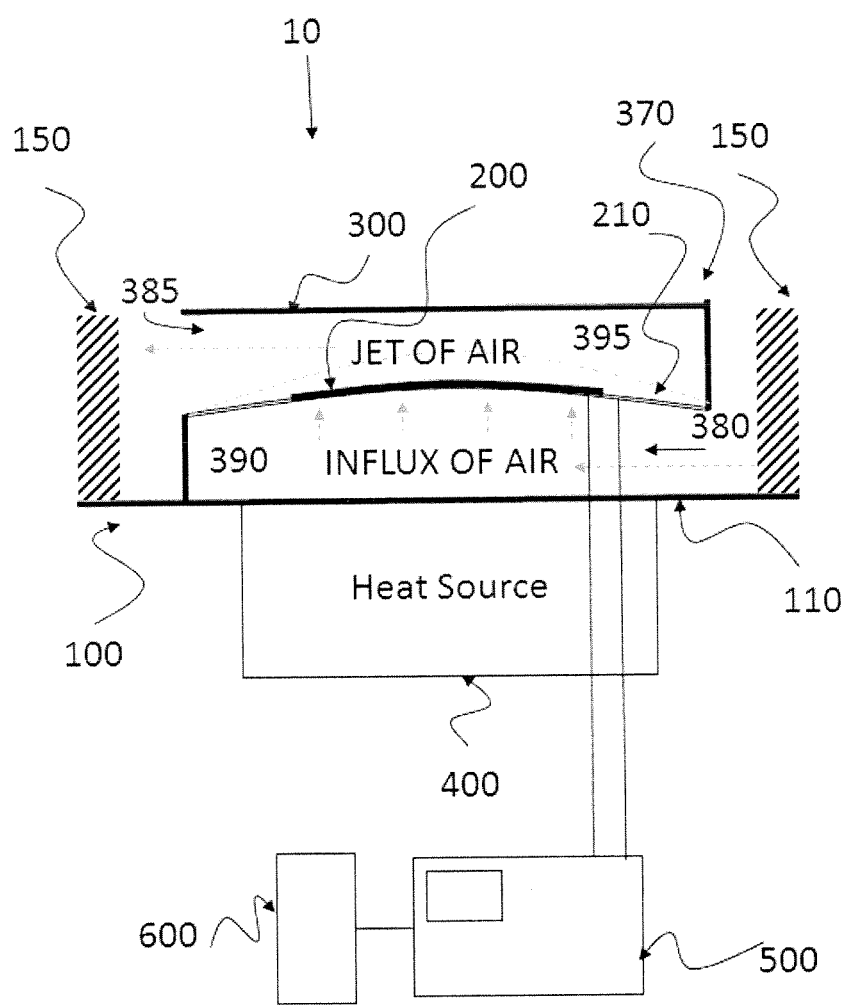
FIG. 4 is a side view of thermal piezoelectric apparatus 10, which is mounted on one surface of heat source 400, in accordance with one embodiment of the present invention.

FIG. 4 is a side view of thermal piezoelectric apparatus 10, including integrated thermal module 100 and piezoelectric device 370, which is mounted on one surface of heat source 400, in accordance with one embodiment of the present invention. As shown in FIG. 4, thermal plate 110 removes heat from heat source 400 and dissipates the heat into heat sinks 150 to maximize the surface area being cooled. Meanwhile, the expansion of chamber 390, as a result of the deformation of piezoelectric element 200, creates an influx of air into chamber 390 through opening 380. Concurrently, the same action of piezoelectric element 200 compresses chamber 395, thus creating a jet of air exiting through opening 385. These airflows not only cool heat sinks 150, but also cool the surface of thermal plate 110, which acts like a conventional fan mounted on top of heat source 400. Thus, thermal piezoelectric apparatus 10 is acting like two fans, one blowing air into different heat sinks 150, and the other blowing air into heat source 400. The combined actions provide greater cooling effects than conventional approaches. In one embodiment, control unit 500 drives one or more two-wire or three-wire piezoelectric 200 elements. The wires are typically connected to piezoelectric element 200 on one of its ceramic surfaces or on an attached metal layer 210 on piezoelectric element 200. An exemplary operating voltage to be applied to piezoelectric element 200 is preferably between 15 V and 150 V. Thus, control unit 500 may be provided a commercial high-voltage switch-mode regulator, such as TI LM5001, to generate a desired voltage between 3.1 V to 75 V. In one embodiment, the desired voltage (e.g., 150 V) is created by serially connecting a negative voltage source (e.g., −75V) and one positive voltage source (e.g., +75 V) "back-to-back". In one embodiment, embedded controller 600 is operatively coupled to the control unit 500. Embedded controller 600 receives a reading of the system temperature from a temperature sensor (not shown in FIG. 4), and based on which directs control unit 500 to increase or decrease the operating voltage, so as to control the volume of air flow in piezoelectric device 370 accordingly.

The above detailed description is provided to illustrate specific embodiments of the present invention and is not intended to be limiting. Numerous variations and modifications within the scope of the present invention are possible. The present invention is set forth in the accompanying claims.

We claim:

1. A piezoelectric apparatus for cooling a heat source, comprising:
    a thermal module in thermal contact with the heat source;
    one or more piezoelectric devices stacked on top the thermal module, each piezoelectric device having a first chamber and a second chamber separated by one or more piezoelectric elements, the first and the second chambers each being enclosed by sidewalls that provide one or more openings for fluid flow into and out of the chamber, such that, when an operating voltage is applied across one of the piezoelectric elements, one of the first and second chambers is compressed while the other one of the first and second chambers is expanded;

a cover element stacked on top of the piezoelectric devices; and a control circuit for electrically driving the piezoelectric elements in the piezoelectric devices by applying operating voltages across piezoelectric elements of the one or more of the piezoelectric devices.

2. The piezoelectric apparatus of claim 1, wherein the thermal module comprises one of: a metal plate, a metal plate to which one or more built-in heat sinks are attached, and a metal plate with one or more heat pipes connecting the metal plate to one or more heat sinks.

3. The piezoelectric apparatus of claim 1, wherein each of the first and second chambers of each piezoelectric device has a height that is greater than a maximum travel distance of each of the piezoelectric elements.

4. The piezoelectric apparatus of claim 2, wherein the heat sinks are positioned next to the openings or serve as the sidewalls of one or more of the first and second chambers.

5. The piezoelectric apparatus of claim 1, wherein the cover element comprises one of: a metal plate, a composite plate, a printed circuit board, and another piezoelectric device.

6. The piezoelectric apparatus of claim 1, wherein a thermal adhesive or a thermal grease is applied between the thermal module and the heat source.

7. The piezoelectric apparatus of claim 1, wherein the thermal module comprise a standalone unit.

8. The piezoelectric apparatus of claim 1, further comprising an embedded controller coupled to the control circuit, wherein the embedded controller acquires a system temperature from a temperature sensor and instructs the control circuit to adjust the voltage on a piezoelectric element, so as to control airflow volume in the first and second chambers.

* * * * *